United States Patent [19]

Sato

[11] 4,110,114
[45] Aug. 29, 1978

[54] IMAGE FORMING METHOD

[75] Inventor: Masamichi Sato, Asaka, Japan

[73] Assignee: Fuji Photo Film Co., Ltd., Minami Ashigara, Japan

[21] Appl. No.: 622,330

[22] Filed: Oct. 14, 1975

[30] Foreign Application Priority Data

Oct. 11, 1974 [JP] Japan .................. 49-117280

[51] Int. Cl.² ............ G03C 5/00; G03C 7/00
[52] U.S. Cl. ........................ 96/36; 96/38.3; 96/50 R; 96/58; 96/48 PD; 156/628; 156/633; 156/634; 156/646; 156/659; 204/192 E; 204/192 EC; 427/34; 427/38; 427/41
[58] Field of Search ........... 204/192, 129.1, 192 E, 204/192 EC; 96/36, 50, 35.1, 38.3, 48 PD, 51, 52, 58; 156/7, 628, 633, 634, 646, 659; 427/34, 38, 41

[56] References Cited

U.S. PATENT DOCUMENTS

| | | | |
|---|---|---|---|
| 3,576,630 | 4/1971 | Yanagawa | 96/36 |
| 3,639,125 | 1/1969 | Chand | 96/35 |
| 3,664,942 | 5/1972 | Hauas et al. | 204/192 |
| 3,733,258 | 5/1973 | Hanak et al. | 204/192 E |
| 3,782,940 | 1/1974 | Ohto et al. | 96/35.1 |
| 3,849,135 | 11/1974 | Karlikowski et al. | 96/36 |
| 3,860,783 | 1/1975 | Schmidt et al. | 204/192 E |
| 3,873,361 | 3/1975 | Franco et al. | 204/192 EC |

*Primary Examiner*—Edward C. Kimlin
*Attorney, Agent, or Firm*—Sughrue, Rothwell, Mion, Zinn and Macpeak

[57] ABSTRACT

An image forming method comprising forming a silver image on a photographic material which comprises a substrate having a silver halide emulsion layer thereon by exposing and developing the photographic material and image-wise ion-etching away the layer to remove non-image areas of the emulsion layer, wherein the silver image is intensified or toned, if desired, before the ion-etching treatment.

33 Claims, No Drawings

IMAGE FORMING METHOD

BACKGROUND OF THE INVENTION

1. Field of the Invention

The present invention relates to a method for producing an image. More particularly, it relates to a method for producing a heat resistant, high contrast image having high resolving power using a photographic material which cmprises a substrate having thereon at least one silver halide emulsion layer, either directly or on at least one subbing layer on the substrate. It also relates to a method for easily producing a durable photomask having high resolving power and good edge sharpness using a photographic material which comprises a transparent substrate having a masking layer thereon, the masking layer having thereon at least one silver halide emulsion layer, either directly or on at least one subbing layer on the masking layer.

2. Description of the Prior Art

The optical density of a silver image formed on a photographic material by exposing and developing a photographic material which comprises a silver halide emulsion layer coated on a substrate gradually decreases from its maximum value to a background value at the edge of the silver image. The spacing between the maximum image density portion and the background is usually about 1 micron. Therefore, it is difficult to obtain a high contrast silver image having closely separated about 1 micron lines or spacings. Silver grains existing between adjacent image lines reduce the image contrast and resolving power.

Moreover, since such an emulsion layer is colored due to thermal decomposition of the binder when heated to about 150° to 200° C, it can not be used for purposes requiring heat resistance.

One field which requires a heat resistant image is "super-microphotography". An image reduced on a 35 mm film from a 9 by 14 inch (23 by 36 cm) size original with a reduction ratio of about 10 is usually called a "microphotograph", and an image further reduced (about 2 by 3 mm) by a factor of about 10 is called a "super-microphotograph". A microphotograph can thus be considered to be an image reduced by a factor of about 10 and a super-microphotograph an image reduced by a factor of about 100.

Since the image size of a super-microphotograph is about 2 by 3 mm or smaller, the enlarging factor is about 100 (1000 based on area ratio) when a super-microphotograph is projected on a screen to provide the original image size. Consequently, a light intensity of about 10 million lux is necessary on the image surface of the super-microphotograph if the image projected on a transmission type screen, e.g., with a blackened back surface, is to have a light intensity of 100 lux when the screen has a transmission optical density of 1. In fact, the super-microphotographic image is illuminated with a light intensity of about 12 to 13 million lux to compensate for the loss of the projection lens. The temperature of the emulsion layer of the super-microphotographic increases to several hundred degrees C, due to the heat generated by the light absorbed in the emulsion layer, when it is continuously illuminated with such a strong light. As a result, the binder of the emulsion layer is thermally decomposed and colored to cause the image projected on the screen to be dim and colored. Since the silver image areas absorb light well, the temperature of these areas preferentially increases and the binder of these areas is preferentially decomposed, whereafter the decomposition spreads into the surrounding areas. Decomposition of the binder in even the non-silver image areas proceeds in an accelerated manner once it is slightly colored and light absorption occurs.

Heretofore, emulsion masks and hard masks have generally been used as photomasks in microelectronic manufacturing processes. However, an emulsion mask has low edge contrast, as described above, and such low mechanical strength that it is easily damaged, that is, durability is poor. On the other hand, a hard mask is quite durable, but the process for production thereof is complicated. Also, the production of a hard mask requires a photoetching process that uses a photoresist which has low sensitivity and requires long exposure times.

SUMMARY OF THE INVENTION

It is, therefore, an object of the present invention to provide a method for producing a heat resistant, high contrast image having high resolving power.

Another object of the present invention is to provide a method for easily producing a durable photomask having high resolving power and good edge acuity.

The first object of the present invention can be attained by exposing and developing a photographic material which comprises a substrate having thereon at least one silver halide emulsion layer, either directly or on at least one subbing layer, to form a silver image, the silver image then being intensified and/or toned if desired, and then imagewise ion-etching away the layer to remove the non-image areas of the emulsion layer.

The second object of the present invention can be attained by exposing and developing a photographic material which comprises a transparent substrate having a masking layer thereon, the masking layer having thereon at least one silver halide emulsion layer, either directly or on at least one subbing layer on the masking layer, to form a silver image, intensifying and/or toning the silver image, imagewise ion-etching away the layer or layers above the masking layer to remove the non-image areas of the emulsion layer and uncover the masking layer lying thereunder, and then etching away the masking layer at the uncovered areas.

DETAILED DESCRIPTION OF THE INVENTION

One type of photographic material of the present invention fundamentally comprises a substrate having thereon a silver halide emulsion layer. If desired, one or more subbing layers can be interposed between the substrate and the silver halide emulsion layer, for example, when the surface of the support is hydrophobic. Another type of photographic material of the present invention fundamentally comprises a transparent substrate having thereon a masking layer and a silver halide emulsion layer. If desired, one or more subbing layers can be interposed between the masking layer and the silver halide emulsion layer.

A hard substrate such as glass, metals, porcelain, and the like, or a flexible substrate, can be used as the substrate of the present invention, depending on the desired end-use of the product. Further, a transparent or opaque substrate can be used.

Typical flexible substrates include substrates as are ordinarily used for photographic light-sensitive materials such as a cellulose nitrate film, a cellulose acetate film, a cellulose acetate butyrate film, a cellulose acetate propionate film, a polystyrene film, a polyethlene terephthalate film, a polycorbonate film, laminates thereof, a thin glass film, heat resistant high melting point polymers such as poly(pyromellitic acid-p-phenylenediamineimide), poly(p-oxybenzoate), poly-(ethylene-2,6-naphthalate), polyamidoimide polymers as described in U.S. Pat. No. 3,554,984, polyimidoimine polymers as described in U.S. Pat. No. 3,472,815, etc., carbon fibers, and the like.

Typical hard substrates include glass (e.g., silica glass, soda lime glass, borosilicate glass, barium glass, potash glass, etc.), ceramics (e.g., hard porcelain, e.g., alumina porcelain, titanium porcelain, beryllia porcelain, mullite porcelain, talc porcelain, spinel porcelain, zircon porcelain, ferrite porcelain, etc., soft porcelain, e.g., fritted porcelain, Sevres porcelain, bone china; etc., earthenware, e.g., glazed and baked earthenware, etc. (earthenware is generally considered to slightly absorb water whereas porcelain does not absorb water), cermets, e.g., $Al_2O_3$-Fe, TiC-Ni, etc., silica, sapphire, metals (e.g., iron, copper, zinc, antimony, nickel, cobalt, aluminum, titanium, chromium, tungsten, molybdenum, gold, platinum, palladium, iridium, rhodium, ruthenium, zirconium, tantalum, hafnium, tellurium, a nickel-iron alloy, a nickel-chromium alloy, an aluminum-iron alloy, a chromium-iron alloy, a chromium-aluminum alloy, a copper-beryllium alloy, a cobalt-iron alloy, a silicon-gold alloy, a titanium-aluminum alloy, a cobalt-nickel alloy, a nickel-chromium-iron alloy, etc.), semi-metals such as silicon, germanium, etc., chalcogen glasses such as As-S-Ge, As-Se-Ge, Ge-S, etc., porcelain enamel (a metal covered with a glaze and then baked), metals having an oxide of the metal layer form thereon, graphite, and the like.

The substrate for a photomask must be transparent since transparency is a necessary condition for mask alignment, as is well known in the field of microelectronic processing.

The term "transparent substrate" as is used herein designates a substrate which comprises a substance capable of transmitting not less than 50%, preferably not less than 70%, of electromagnetic waves in the near-ultraviolet (e.g., about 2900 A to 4000 A) and visible light regions (e.g., about 4000 A to 7000 A).

The masking layer is provided by depositing a masking material on a transparent substrate using vacuum deposition, sputtering, ion plating, chemical plating or the like. Suitable masking materials are metal oxides such as silicon oxide, chromium oxide, ferric oxide, magnetic iron oxide (iron (II)-iron (III) oxide), cuprous oxide, cupric oxide, nickel oxide, cobalt oxide, germanium oxide, cadmium oxide, titanium oxide, tantalum oxide, etc., metals such as chromium, aluminum, silver, titanium, cobalt, tungsten, nickel, tellurium, gold, platinum, iridium, palladium, rhodium, molybdenum, tantalum, a nickel-iron alloy, a nickel-chromium-iron alloy, an aluminum-iron alloy, a chromium-iron alloy, a chromium-aluminum alloy, a nickel-chromium alloy, a nickel-cobalt alloy, a cobalt-iron alloy, a silicon-gold alloy, a titanium-aluminum alloy, a copper-beryllium alloy, etc., semi-metals such as silicon, germanium, etc., chalcogen glasses such as As-S-Ge, As-Se-Ge, Ge-S, etc., and mixtures of oxides of such metals on the metal such as chromium oxide on chromium, cobalt oxide on cobalt, silicon oxide on silicon, etc.).

The masking material provides a masking effect, particularly to ultraviolet light, and is preferably selected from those materials which transmit visible light and absorb ultraviolet light.

The thickness of the masking layer cannot be set forth unequivocally since thickness varies depending upon the end-use thereof. However, in general, a thickness ranging from about 0.01 $\mu$ to 10 $\mu$, preferably 0.07 $\mu$ to 1.5 $\mu$, is employed. If the thickness is too small, absorption of ultraviolet light is too small, while if the thickness is too large, the etching takes too long and side-etching occurs, which is not desirable. Since a metal or metal oxide possesses much greater mechanical strength than a photographic emulsion layer or the like, the masking layer renders the photomask (support plus image-wise masking layer) scratch resistant.

The subbing layer used in the present invention is a layer which intimately adheres to both the substrate and the silver halide emulsion layer, or to both the masking layer and the silver halide emulsion layer. When the substrate or the masking layer differs substantially in properties from the silver halide emulsion layer, two or more subbing layers can be employed which adhere well to the layer to which they are closed and, of course, to each other. Suitable subbing layers are gelatin, gelatin derivatives as later described for the water-soluble binder, albumin, casein, cellulose derivatives as later described for the water-soluble binder, starch derivatives, sodium alginate, polyvinyl alcohol, poly-N-vinyl pyrrolidone, polyacrylic acid copolymers as later described for the water-soluble binder, polyacrylamide, alcohol-soluble polyamide resins as described in Japanese Patent Publication No. 5509/64, a mixture of a cellulose ester and a polyester of terephthalic acid-glycols as described in Japanese Patent Publication No. 14503/68, a mixture of gelatin and nitrocellulose as described in Japanese Patent publication No. 2597/69, compounds as described in Japanese Patent Publication No. 11616/71, homopolymers or copolymers of glycidyl (metha)acrylate as described in West German Patent OLS 2,001,727, etc. Also, a subbing layer formed by providing a thin polyvinyl acetate layer (for example, at a thickness of about 0.1 to 0.3 $\mu$) and bringing the surface into contact with an aqueous alkaline solution such as an aqueous solution of sodium hydroxide for saponification can be used. A suitable thickness for the subbing layer can range from about 0.1 to 0.5 $\mu$.

The silver halide emulsion to be used in the present invention can be obtained by dispersing silver halide in a water-soluble binder. Illustrative silver halides are silver chloride, silver bromide, silver iodide, silver chlorobromide, silver bromoiodide, silver chlorobromoiodide, mixtures thereof, etc. While any silver halide emulsion can be used, emulsions having silver halide grains smaller than 0.1 $\mu$ are preferred to obtain higher resolving power. The grain size of the emulsion is not limited to such sizes as those are merely preferred. The weight ratio of silver halide to the water soluble binder (dry weight) is preferably about 1:6 to about 6:1, though this is not limitative.

A most typical silver halide emulsion is an emulsion which contains about 90 mol% or more silver bromide (preferably containing not more than about 5 mol% silver iodide) and contains silver halide grains of a mean grain size of not more than about 0.1 $\mu$ (a so-called Lippmann emulsion), in which the weight ratio of silver halide to the water-soluble binder is about 1:4 to about 6:1. Another example of a silver halide emulsion is an emulsion which contains about 50 mol% or more (preferably 70 mol% or more silver chloride and contains silver halide grains of a mean grain size of not more than about 0.1 μ.

On the other hand, examples of water-soluble binders include gelatin, colloidal albumin, casein, cellulose derivatives (e.g., carboxymethyl cellulose, hydroxyethyl cellulose, etc.), saccharide derivatives (e.g., agar-agar, sodium alginate, starch derivatives, etc.), synthetic hydrophilic colloids (e.g, polyvinyl alcohol, poly-N-vinyl pyrrolidone, polyacrylic acid copolymers, polyacrylamide, derivatives thereof, etc.). If desired, a compatible mixture of two or more of these binder can be used. Of these, a most preferred binder is gelatin which can be replaced, partly or completely, by a synthetic high molecular weight substance, by a gelatin derivative (prepared by processing gelatin with a compound having a group capable of reacting with the functional groups contained in the gelatin molecule (i.e., amino groups, imino groups, hydroxy groups or carboxy groups)), or by a graft polymer prepared by grafting a molecular chain of some other high molecular weight substance onto the gelatin. Suitable compounds for preparing gelatin derivatives are isocyanates, acid chlorides and acid anhydrides as described in U.S. Pat. No. 2,614,928, acid anhydrides as described in U.S. Pat. No. 3,118,766, bromoacetic acids as described in Japanese Patent Publication 5514/64, phenyl glycidyl ethers as described in Japanese Patent Publication No. 21845/67, vinyl sulfone compounds as described in U.S. Pat. No. 3,132,945, N-allylvinylsulfonamides as described in British Pat. No. 861,414, maleinimide compounds as described in U.S. Pat. No. 3,186,846, acrylonitriles as described in U.S. Pat. 2,594,293, polyalkylene oxides as described in U.S. Pat. No. 3,312,553, epoxy compounds as described in Japanese Pat. No. Publication 26845/67, acid esters as described in U.S. Pat. No. 2,763,639, alkanesulfones as described in British Pat. No. 1,033,189, etc. Description of suitable branch high polymers to be grafted on gelatin are given in U.S. Pat. Nos. 2,763,625; 2,831,767; and 2,966,884; *Polymer Letters,* 5, 595 (1967), *Photo. Sci. Eng.,* 9, 148 (1965), *J. Polymer Sci. A-1,* 9, 3199 (1971), and the like. Homopolymers or copolymers of compounds which are generally called vinyl monomers, such as acrylic acid, methacrylic acid, the ester, amide, and nitrile derivatives thereof, styrene, etc., are widely used for grafting to gelatin.

Hydrophilic vinyl polymers having some compatibility with gelatin, such as homopolymers or copolymers of acrylic acid, acrylamide, methacrylamide, hydroxyalkyl acrylate, hydroxyalkyl methacrylate, etc., i.e., copolymers of these materials among themselves and copolymers of these materials with other comonomers, are particularly preferred.

The silver halide emulsion is advantageously optically sensitized with one or more known optical sensitizers such as the cyanine dyes and merocyanine dyes as described in U.S. Pat. Nos. 1,346,301, 1,846,302, 1,942,854, 1,990,507, 2,493,747, 2,739,964, 2,493,748, 2,503,776, 2,519,001, 2,666,761, 2,734,900, and 2,739,149, and British Pat. No. 450,958.

The silver halide emulsion can be exposed with electromagnetic radiation to which the silver halide emulsion is sensitive, e.g., visible, ultraviolet, electron beam, X-ray radiation, etc. With optically sensitized photographic light-sensitive materials, it is convenient to select radiation mainly having a wavelength corresponding to the optically sensitized region of the emulsion as the light for exposing the emulsion layer.

The emulsion is advantageously chemically sensitized with salts of noble metals such as ruthenium, rhodium, palladium, iridium, platinum, etc., as described in U.S. Pat. Nos. 2,448,060, 2,566,245, and 2,566,263. Also, the emulsion can be chemically sensitized with a gold salt as described in U.S. Pat. No. 2,339,083 or stabilized against fogging with a gold salt as described in U.S. Pat. Nos. 2,597,856, and 2,597,915. Furthermore, a thiopolymer as described in U.S. Pat. No. 3,046,129 can advantageously be incorporated in the emulsion to prevent fogging. In addition, the emulsion can be stabilized to prevent fogging with mercury compounds as described in U.S. Pat. No. 3,046,129, column 20, line 51 to column 21, line 3, triazoles, azaindenes, disulfides, quaternary benzothiazolium compounds, zinc salts and cadmium salts.

The emulsion can also contain light-absorbing dyes as described in U.S. Pat. Nos. 2,627,583, 2,611,696, 3,247,127, 3,260,601, etc., if desired.

The emulsion is advantageously hardened with a suitable hardening agent for hydrophilic colloids, such as formaldehyde or a like hardener; N-methylol compounds as described in U.S. Pat. Nos. 2,732,316 and 2,586,168, carbodiimide compounds as described in U.S. Pat. No. 3,091,537, halogen-substituted fatty acids (e.g., mucochloric acid, muchbromic acid, etc.); compounds having a plurality of acid anhydride groups; methanesulfonic acid disesters; dialdehydes or the sodium bisulfate adducts thereof such as β-methylglutaraldehyde bis(sodium hydrogen sulfite) addition products; bisaziridinecarboxyamide (e.g., trimethylene-bis(1-aziridinecarboxyamide)); triazine derivatives (e.g., 2-hydroxy-4,6-dichloro-s-triazine, etc.); and the like.

The silver halide emulsion can be coated on a substrate or masking layer as it is or after adding a coating aid thereto as described in U.S. Pat. No. 3,046,129. The silver halide emulsion layer preferably has a thickness of about 0.3 μ to 10 μ and can be coated in one or more layers on the masking layer or on one or both surface of the substrate. When two layers of the silver halide emulsion are used on one surface of the support, the total thickness is less than about 10 μ, and when two layers are formed separately on both surfaces of the support, the total thickness is not more than about 20 μ (dry basis). When a silver halide emulsion is applied to both sides of the support, both emulsions can, of course, be subjected to processing in accordance with the present invention. The thickness of the emulsion layer can be suitably selected depending upon the end-use of the material manufactured.

If desired, a backing layer, an antihalation layer, an interlayer, an uppermost layer (e.g., a protective layer, etc.), and the like can be provided on the substrate, the masking layer or on the emulsion layer.

The formation of a silver image in the silver halide emulsion layer can be effected using conventional photographic processings, that is, by development processing the exposed emulsion layer and, if necessary, fixing. Conventional photographic processings including exposure, development, fixing, etc., which can be used are described in detail in "Techniques of Microphotography" *Kodak Data Book P-52.* Eastman Kodak Co., Rochester, N.Y.

Developing agents, which can be used in the method of the present invention for forming silver images are those well known in the art, and include developing agents such as the dihydroxybenzenes (e.g., hydroquinone, 2-chlorohydroquinone, 2-bromohydroquinone, 2-isopropylhydroquinone, toluhydroquinone, 2-phenylhydroquinone, 2,3-dichlorohydroquinone, 2,5-dimethylhydroquinone, pyrogallol, etc.), the 3-pyrazolidones (e.g., 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), the aminophenols (e.g., o-aminophenol, p-aminophenol, o-(methylamino)phenol, p-(methylamino)phenol, p-(diethylamino)phenol, 2,4-diaminophenol, p-(benzylamino)phenol, etc), ascorbic acid, the 1-aryl-3-aminopyrazolines (e.g., 1-(p-hyroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, etc.), N-(p-hydroxyphenyl)glycine, the compounds described as developing agents in C.E.K. Mees & T.H. James, *The Theory of Photographic Process*, 3rd Edition, Chapter 13, Macmillan Co., New York (1966), L.F.A. Mason, *Photographic Processing Chemistry*, pp. 16–30, The Focal Press, London (1966), and mixtures thereof. The developer generally possesses a pH of not less than about 8, preferably about 8.5–12.5.

The developer can contain, if desired, an alkali agent (e.g., a hydroxide of an alkali metal or ammonium, carbonate, borate, etc.), a pH-adjusting agent or buffer (e.g., a weak acid or alkali such as acetic acid, boric acid, a salt thereof, etc.), a development promoting agent (e.g., pyridinium compounds and cationic compounds as described in U.S. Pat. Nos. 2,648,604 and 3,671,247, potassium nitrate, sodium nitrate, condensation products of polyethylene glycol and derivatives thereof as described in U.S. Pat. Nos. 2,533,990, 2,577,127, and 2,950,970, nonionic compounds such as polythioethers represented by compounds as described in British Pat. Nos. 1,020,033 and 1,020,032, pyridine, organic amines such as ethanolamine, benzyl alcohol, hydrazines, etc.), an antifogging agent (e.g., an alkali bromide, alkali iodide, nitrobenzimidazoles as described in U.S. Pat. No. 2,496,940 and mercaptobenzimidazole, 5-methylbenztriazole, 1-phenyl-5-mercaptotetrazole, compounds for a rapid developing solution as described in U.S. Pat. Nos. 3,113,864, 3,342,596, 3,295,976, 3,615,522, and 3,597,199, thiosulfonyl compound as described in British Pat. No. 972,211, phenazine-N-oxides as described in Japanese Patent Publication No. 41675/71, antifogging agents as described in *Handbook of Scientific Photography*, Vol. 2, pp. 29–47, Maruzen, Tokyo (1959), etc.), stain or sludge preventing agents as described in U.S. Pat. Nos. 3,161,513 and 3,161,514 or British Pat. Nos. 1,030,442, 1,144,481, and 1,251,558, a preservative (e.g., a sulfite, an acid sulfite, hydroxylamine, hydrochloride, formaldehyde sulfite adduct, ethanolamine sulfite adduct, etc.), a surface active agent, etc.

On the other hand, suitable fixing agents for the silver halide are the generally well known solvents for silver halides, such as a water-soluble thiosulfate (e.g., potassium thiosulfate, sodium thiosulfate, ammonium thiosulfate, etc.), a water-soluble thiocyanate (e.g., potassium thiocyanate, sodium thiocyanate, ammonium thiocyanate, etc.), a water-soluble organic diol (e.g., 3-thia-1,5-pentanediol, 3,6-dithia-1,8-octanediol, 3,6,9-trithia-1,11-undecanediol, 3,6,9,12-tetrathia-14-tetradecanediol, etc.), a water-soluble sulfur-containing organic dibasic acid (e.g., ethylenebisthioglycolic acid, etc.), a water-soluble salt thereof (e.g., potassium ethylenebisthioglycolate, sodium ethylenebisthioglycolate, etc.), and mixtures thereof.

The fixing solution can contain, if desired, a preservative (e.g., a sulfite, a bisulfite, etc.), a pH-buffer (e.g., boric acid, a borate, etc.), a pH-adjusting agent (e.g., acetic acid, etc.), a chelating agent, and the like.

A silver image is formed in the exposed areas, and in the unexposed areas, silver halide is removed by fixing while the binder in the silver halide emulsion layer in unexposed areas remains intact. Where the silver halide emulsion is a reversal-type emulsion or where reversal processing is conducted, the binder layer remains in exposed areas, whereas a silver image is formed in the unexposed areas.

In the present invention, the term "non-silver image areas" (non-image areas) designates areas other than silver image areas or silver halide image areas (image areas). The terms "silver image areas" or "silver halide image areas" and "non-silver image areas" or "non-silver halide image areas" do not necessarily mean light exposed areas and light unexposed areas, respectively. Image areas and non-image areas do not necessarily designate images or non-images formed by silver or silver halide and, in some cases, they mean image areas or non-image areas formed by a binder.

Expanding upon the above with an exemplification, silver halide image is formed by a conventional reversal development. For example, a silver halide emulsion is exposed and developed, and then bleached with an aqueous solution containing potassium dichromate and sulfuric acid. Also, a silver halide image is formed by converting a silver image to a silver halide image. For example, a silver image is bleached with an aqueous solution containing potassium dichromate and hydrochloric acid to convert silver into silver halide.

A binder image can be formed, for example, by bleaching a silver image with an aqueous solution containing potassium dichromate and hydrochloric acid and then removing the silver halide formed by bleaching with a fixing solution.

The photographic material in which a silver or silver halide image is formed is then ion-etched. The term "ion-etching" as used in the present invention designates the procedure of bombarding ions having a high energy against a substance so that the substance bombarded is removed. (see R. G. Wilson & G. R. Brewer, *ION BEAMS With Application to Ion Implantation* pp. 317–335, John Wiley & Sons, (1973) and L. I. Maissel & R. Glang, *Handbook of Thin Film Technology* pp. 7–49 – 7–53, McGraw-Hill, (1971)). One example of ion-etching is cathode sputtering. Other examples are etching by glow discharge and by RF discharge.

It should thus be clear from the principle of the present invention that the ion-bombarding technique used in the present invention is not limited only to sputtering or such other techniques, on the contrary, any ion-bombarding techniques developed which result in removal of the substance bombarded can be employed, and cathode sputtering is only one example of the ion-etching of the present invention to preferentially remove non-image areas from the photographic material.

It has heretofore been known that sputtering causes etching. However, until recently it had not been known that the rate at which non-silver image areas are ion-etched or sputter-etched is greater than the rate of etching in image areas, and the discovery of this phenomenon is an important aspect of the present invention. In fact, it has been confirmed that when a coated surface of a photographic material (i.e., silver or silver halide image areas and a binder layer) is subjected to cathode sputtering, non-image areas are etched away while the image areas are merely decreased in thickness at an extremely slow rate. Therefore, ion-etching is satisfactorily effected when the non-silver image areas are removed to uncover the underlying substrate while the image areas remain.

Although ion-etching depends upon the sputtering conditions (frequency, power, distance between electrodes, gas and gas pressure), it is satisfactorily effected so that the photographic material is not charged to prevent sputtering. Further, the binder in the non-image portion is not necessarily completely removed by sputter-etching of the emulsion layer and can remain in small amounts, i.e., the binder is present in non-image portions in such an amount that the etching solution can penetrate into the emulsion layer.

In ion-etching, direct current, alternating current or a combination of direct current and alternating current can be used. Alternating current is preferred where the material to be etched is insulating.

Generally used condition for ion-etching are set out below. The conditions apply to the A.C., D.C. or combined A.C./D.C. embodiments, though of course frequency is not a factor for the D.C. embodiment. Suitable electrodes which can be used include any solid conductor. Examples of typical solid conductors include stainless steel, iron, chromium, nickel, titanium, and the like. Suitable sizes can range from several cm to several tens of cm or more, depending on the capacity of the electrical power source. The electrodes can have a circular, square or rectangular shape. The size of the electrodes can vary widely with the photographic material to be etched. Generally, the electrodes have a somewhat larger size than that of the photographic material, e.g., about 1 to 2 cm larger than the size of the photographic material. A typical size is about 2 to about 50 cm in diameter when the electrodes are circular (disc shape) in shape and the size can range up to about 1 m in length when they are rectangular in shape.

A suitable electrode separation distance can range from several cm to several tens of cm and will vary with the voltage applied, with the rule being the higher the voltage the larger the separation distance. A suitable separation is generally about 1, preferably 3 cm, to about 20 cm, preferably 15 cm.

The voltage employed can range from several hundred volts to several tens of KV, e.g., from about 300 V, preferably 500 V, to 30 KV, with a frequency ranging from about 10 tc about 30 MHz when an alternating current is employed.

Suitable temperatures which can be used range from about room temperature (e.g., about 20°–30° C) to about 600° C, the upper limit thereof corresponding to the baking temperature described hereinafter, and suitable pressures range from about $10^{-3}$ to about $10^{-1}$ Torr.

The ion-etching can be conducted in a gaseous atmosphere such as air, argon, oxygen, nitrogen, hydrogen, helium, xenon, krypton, carbon monoxide, carbon dioxide, etc., or a mixture thereof. There is no particular limitation on the identity of the gaseous atmosphere used.

The time generally ranges from several tens of seconds to several tens of minutes (e.g., about 20 seconds to about 1 hour).

It has been found that if the emulsion layer is heated to a high temperature before the ion-etching, the binder is decomposed and the ion-etching rate is greatly increased. Baking (hereafter the heating process is designated baking) can be effected by heating in air, any other gas such as oxygen, nitrogen, argon, helium, xenon, krypton, carbon monoxide, carbon dioxide, etc., or in a vacuum at temperature above about 150° C, preferably 250° to 600° C, most preferably 300° to 600° C, to decompose the binder. There is no particular limitation on the atmosphere of baking. If the heating temperature is lower than about 150° C, the baking takes a long time, while if the temperature is higher than 600° C, the substrate might be deformed. The baking time is the time to decompose the binder and depends on the baking temperature. The preferred range for the baking time is about 1 to about 60 min., most preferably 2 to 30 min. For instance, when the binder mainly comprises an alkali treated gelatin at a thickness of 2 $\mu$, a baking time of 2 to 3 minutes is sufficient at 400° C. A relatively large binder thickness has no influence on the time of baking. However, when the thickness is very small (e.g., less than about 0.5 $\mu$), a lower baking time gives better results. It has been found that by baking the rate of the ion-etching can be increased as much as 5 to 8 times. Baking effects all binder present, both in image and non-image areas.

Ion-etching is completed when the non-image areas are removed to uncover the substrate thereunder. The binder of the thus obtained image, which contains silver or silver halide, is decomposed by the heat generated during the ion-etching or by baking as described above. Strictly speaking, small amounts of the decomposed binder are probably gasified during baking, or some component capable of being easily volatilized at high temperature might be vaporized by baking. However, in the present invention such amounts are insignificant. If the sputtering power is low, the amount of heat generation is small, hence the binder is not always decomposed. In those embodiments when the binder is decomposed, ion-etching proceeds at a rapid rate, whereas when the binder is not decomposed, ion-etching proceeds at a slower rate. Both embodiments are within the invention.

The thus obtained image is heat resistant because no binder exists at the non-image areas. Further, it has been found that the smoothness of the edges and the contrast (and, therefore, the resolving power) of the image in comparison with the original silver image formed in the emulsion layer using known methods is greatly increased.

According to another embodiment of the present invention, the silver or silver halide image is intensified and/or toned using known methods before ion-etching. By intensification and/or toning (hereafter simply designated intensification), the silver image is converted to another material or other materials are added to the silver image. As a result, it has been found that the rate of ion-etching at intensified silver or silver halide image areas in comparison with (unintensified) silver image areas is greatly decreased. If the rate of ion-etching at the image areas is small, the suitable time range for ion-etching increases and, therefore, ion-etching processing is greatly simplified. In other words, the ion-etching time becomes non-critical. Intensification is used with non-baked emulsion layers. Of course, when the primary baking temperature is low and the baking time is small (e.g., 150° C, 2 min.), the binder is not completely decomposed. In such a case, intensification can be used with a baked emulsion layer; however, such takes a longer intensifying time, and accordingly, is not convenient from a practical standpoint.

General methods for intensification are described in Pierre Glafkides "Photographic Chemistry" Vol. 1, pp. 189-199 and Vol. 2, pp. 643-662, Fountain Press, London (1958). Suitable examples are mercury intensification, copper intensification, lead intensification, uranium toning, selenium toning, sulfur toning, iron toning, nickel toning, cobalt toning, copper toning, vanadium toning, titanium toning, lead chromate toning, cadmium toning, noble metal toning, etc. Of these, vanadium toning, titanium toning, iron toning, nickel toning, cobalt toning, copper toning, rhodium toning, palladium toning and lead chromate toning are most preferred, since the rate of ion-etching of the image toned by these methods is very small.

The second object of the present invention can be attained by exposing and developing a photographic material which comprises a transparent substrate having a masking layer thereon, the masking layer having thereon at least one silver halide emulsion layer, either directly or on at least one subbing layer on the masking layer, to form a silver image, intensifying and/or toning the silver image, imagewise ion-etching away the layer or layers above the masking layer to remove the non-image areas of the emulsion layer and uncover the masking layer lying thereunder, and then etching away the masking layer at the uncovered areas. Baking as earlier described can, of course, be used with this embodiment.

The uncovered masking layer at the non-image areas is removed by ion-etching using conditions as earlier exemplified or chemical etching. The emulsion layer remaining at the image areas acts as a resist for this ion-etching. The ion-etching of the masking layer is successfully conducted if the emulsion layer at the image areas still remains or just disappears when the masking layer is just removed by ion-etching, whereas the ion-etching is unsuccessful if the emulsion layer at the image areas is completely removed and the masking layer has not been completely removed by the ion-etching. Therefore, a necessary requirement for the result (the emulsion layer at the image areas) is that it much have a low ion-etching rate. When the masking layer is made of a substance which is hard to remove by ion-etching, such as chromium, this requirement is particularly important.

In the present invention the thickness of the resist layer (emulsion layer at image areas) is generally much larger than that of the masking layer, therefore, it is not always necessary that the ion-etching rate of the resist layer be smaller than that of the masking layer. For instance, when a chromium layer at a thickness of 0.1 $\mu$ as a masking layer and an emulsion layer at the image areas at a thickness of 3 $\mu$ as a resist are used, the ion-etching rate of the resist layer can be about 20 times of that of the masking layer. When removal of the masking layer is effected by ion-etching, an intensification treatment as already described is particularly important.

Chemical etching as is used in this invention includes etching with an etching solution. Etching is effected using methods as are usually employed for metals or metal oxides. Suitable etching solutions which can be used for chromium and chromium oxide ($Cr_2O_3$) include an aqueous solution of cerium ammonium nitrate (at a concentration of about 80 to 250 g/liter) and 60 to 70% perchloric acid (in an amount of about 20 to 80 ml/liter) with an etching time of about 15 seconds to 10 minutes at a temperature of about 15° to 40° C, or an aqueous solution of cerium (IV) sulfate (at a concentration of about 40 to 200 g/liter) and 98 wt % sulfuric acid (in an amount of about 20 to 100 ml/liter) with an etching time of about 20 seconds to about 10 minutes at a temperature of about 15° to 40° C, etc.; for iron oxide include an aqueous solution of hydrochloric acid (at a concentration of about 1 to 12N) with an etching time of about 10 seconds to 4 minutes at a temperature of about 30° to about 60° C, etc., for silicon dioxide include hydrofluoric acid in an aqueous solution (at a concentration of about 6 to 48% by weight) with an etching time of about 10 seconds to 1 minute at a temperature of about 15° to 40° C, a mixture of about 0.5 to 2 parts by volume of hydrofluoric acid (48% by weight aqueous solution) and about 6 to 24 parts by volume of ammonium fluoride (40% by weight aqueous solution) with an etching time of about 30 seconds to 5 minutes at a temperature of about 15° to 40° C, etc.; for nickel include an aqueous solution of ferric chloride (at a concentration of about 5 to 300 g/liter) with an etching time of about 1 to 5 minutes at a temperature of about 15° to 40° C, etc.; for titanium include an aqueous solution of hydrofluoric acid (at a concentration of about 5 to 40% by weight) with an etching time of about 20 seconds to 2 minutes at a temperature of about 20° to 40° C, etc.

After the uncovered masking layer is etched away, the emulsion layer can be swollen or dissolved for removal together with the silver, silver salt or compounds formed by the intensifying treatment, if desired. The removal of binder can be effected using an alkali (e.g., an aqueous solution of sodium hydroxide or potassium hydroxide at a concentration of about 10 to 20% by weight at about 40° to 60° C for about 2 to 10 minutes, etc.), an acid (e.g., a concentrated sulfuric acid (98% by weight) at about 60° to 98° C for about 5 to 10 minutes, or concentrated nitric acid (70% by weight) at about 60° to 95° C for about 2 to 10 minutes, etc.) or a salt (e.g., an aqueous solution of sodium hypochlorite or potassium hypochlorite at a concentration of about 5 to 10% by weight at about 30° to 60° C for about 2 to 10 minutes, etc.). The only substantial limitation on the binder removing solution is that it should not attack or dissolve the masking layer. See U.S. Pat. No. 3,567,447 for additional examples.

In the following cases the resist is preferably not removed: (i) when pin-holes exist in the masking layer; the remaining emulsion layer can have sufficient optical density (e.g., 1.5 to 3.0 or more), therefore, the emulsion layer on the masking layer can optically mask the pin holes. (ii) When the masking layer is highly reflective. For example, a chromium layer has a reflection of 60 to 80%. (iii) When a mechanical buffer is desired on the masking layer. The masking layer is hard and thin, and, e.g., could be cracked when contacted with a silicon wafer. If a mechanical buffer layer exists on the masking layer, such will be avoided. The emulsion layer of an emulsion mask acts as a buffer; the remaining resist (emulsion layer) of the present invention acts as a buffer.

Since the present invention employs conventional techniques used industrially in photolithography, photo-etching and ion-etching in producing semi-conductor devices, it can be practiced without substantially altering conventional techniques, apparatus and equipment, and the benefits of the invention in this field are extremely great.

The following examples are given to illustrate the invention in greater detail. Unless otherwise indicated, all parts, percents, ratios and the like are by weight.

EXAMPLE 1

1400 ml of a silver bromide emulsion (mean grain size of silver bromide: about 0.06 u) was prepared using 50 g of gelatin and 188 g of silver bromide in a conventional manner. To this emulsion was added 0.25 g of 4-methyl-2,3-di-ethoxathiazolocarbocyanine iodide to optically sensitize the emulsion to light of a wavelength of 510 mμ to 530 mμ. Then, the emulsion was coated to obtain a dried thickness of about 6 μ on a soda lime glass plate, and then dried to obtain a photographic light-sensitive material. This photographic light-sensitive material was image-wise exposed [exposed to light from a tungsten lamp through a green filter (Kodak Wratten No. 58B) for 3 sec. The light intensity on the green filter was about 1000 lux (intensity of light just before reaching the green filter)] and development processed in a developer having the following composition (24° C, 5 min.), followed by fixing in a fixing solution having the following composition (24° C, 1 min.) to obtain a silver image.

| Developer | |
|---|---|
| 1-Phenyl-3-pyrazolidone | 0.5 g |
| Sodium Sulfite (anhydride) | 50 g |
| Hydroquinone | 12 g |
| Sodium Carbonate (monohydride) | 60 g |
| Potassium Bromide | 2 g |
| Benzotriazole | 0.2 g |
| 1-Phenyl-5-mercaptotetrazole | 5 mg |
| Phenazine-2-carboxylic Acid | 1 g |
| Water to make | 1 liter |
| Fixing Solution | |
| 70% Ammonium Thiosulfate Aqueous Solution | 200 ml |
| Sodium Sulfite (anhydride) | 15 g |
| Boric Acid | 8 g |
| Glacial Acetic Acid | 16 ml |
| Ammonium Sulfate | 10 g |
| Sulfuric Acid (98%) | 2 ml |
| Water to make | 1 liter |

After rinsing in water and drying, the photographic material was placed in a sputtering apparatus (model "FP-46"; made by Nippon Electric-Varian K.K. Ltd.) to conduct ion-etching. The conditions of ion-etching were as follows:

| | |
|---|---|
| Frequency: | 13.56 MHz |
| High Frequency Power: | 500 W |
| Distance Between Electrodes: | 50 mm |
| Gas: | Argon |
| Gas Pressure: | $1.2 \times 10^{-2}$ Torr |
| Electrodes: | Stainless steel; Size: 170 mm$^\phi$, |
| Temperature: | Room temperature (23–26° C); Voltage: 2 KV |

About 60 minutes were required to completely remove the gelatin layer at non-image areas. The silver image mained in silver image areas without being completely etched away.

The thus obtained silver image was heat resistant (the image was not damaged when heated to 500° C) and had a high resolving power (1 μ lines reproduced well).

EXAMPLE 2

The same procedures as described in Example 1 were followed except that the emulsion layer was heated in air at 400° C for 3 minutes and that the ion-etching took 10 minutes. The thus obtained silver image was heat resistant as described in Example 1, whereas the resolving power, edge smoothness of image lines and image contrast were better than obtained in Example 1.

EXAMPLE 3

The same procedures as described in Example 2 were followed except that the silver image was toned in an aqueous solution of rhodium chloride ($RhCl_3$) at a concentration of 0.3% by weight for 2 minutes at 20° C and that silver chloride formed by the toning was reduced to silver using the developer in Example 1. The thus obtained image had almost the same heat resistance, resolving power and contrast as obtained in Example 2.

EXAMPLE 4

The same procedures as described in Example 3 were followed except that the ion-etching was conducted for 15 minutes. Almost the same results as described in Example 3 were obtained.

EXAMPLE 5

The same silver halide emulsion as described in Example 1 was coated to obtain a dry thickness of about 0.5 μ on a chromium layer of a thickness of about 0.1 μ which had been vacuum deposited on a glass plate of a thickness of 1.6 mm to obtain a photographic light-sensitive material. A silver image was formed in the emulsion layer of this photographic material in the same manner as described in Example 1, then the photographic material was heated in air at about 400° C for 2 minutes, and then ion-etching as described in Example 1 of the layer was conducted with a high frequency power of 500 W for 1 minute.

The decomposed gelatin at the non-image areas was almost completely removed, whereas the emulsion layer at the image areas was decreased in thickness (to about ⅓ of that before baking) out not completely removed by ion-etching. The remaining emulsion layer at the image areas would not serve as a resist for chemical etching of the chromium layer. When the high frequency power of the ion-etching was reduced to 350 W (but kept otherwise as in Example 1), the binder layer at the image areas would function as a resist after 1 minute of ion-etching.

On the other hand, when the silver image was toned using the following toning solution (25° C, 30 min.) before ion-etching, a good result was obtained after rinsing in water, drying and ion-etching of the photographic material with high frequency power of 500 W for 1 minute. Ion-etching with high frequency power of 400 W for 2 minutes also provided a good results. Conditions were otherwise as in Example 1.

| Toning Solution | |
|---|---|
| A solution prepared by adding 40 ml of a 20% potassium ferricyanide aqueous solution to a solution comprising: | |
| 10 wt % Aqueous Solution of Titanium Sulfate | 100 ml |
| Saturated Aqueous Solution of Oxalic Acid | 25 ml |
| Glycerin | 50 ml |
| Saturated Aqueous Solution of Potassium Alum | 50 ml |
| Water to make | 1 liter |

The composition of the etching solution for chromium was as follows:

| Chromium Etching Solution | |
|---|---|
| Cerium Ammonium Nitrate | 164.5 g |

| | |
|---|---|
| 70% Perchloric Acid Aqueous Solution | 43 ml |
| Water to make | 1 liter |

The etching time of the chromium layer was about 1 minute at 20° C.

EXAMPLE 6

The same silver halide emulsion as described in Example 1 was coated to obtain a dry thickness of about 5 μ on a germanium layer of a thickness of about 0.1 μ which had been vacuum deposited on a glass plate of a thickness of 1.6 mm to obtain a photographic material. A silver image was formed in the emulsion layer of this photographic material in the same manner as described in Example 1, and then the silver image was toned using a toning solution having the following composition (20° C, 25min.).

| Toning Solution | |
|---|---|
| 20% Vanadium Oxalate Aqueous Solution | 50 ml |
| Saturated Oxalic Acid Aqueous Solution | 50 ml |
| Saturated Ammonium Alum Aqueous Solution | 50 ml |
| 20% Ferric Oxalate Aqueous Solution | 100 ml |
| Glycerin | 50 ml |
| 10% Potassium Fericyanide Aqueous Solution | 10 ml |
| Water to make | 1 liter |

After rinsing in water and drying, the photographic material was heated in air at 350° C for 5 minutes, and then ion-etching was conducted for 20 minutes in the same way as described in Example 1. The germanium masking layer at the non-image areas was completely removed, whereas the germanium masking layer at the image areas was not etched. The thus obtained photomask was durable and possessed high resolving power.

EXAMPLE 7

A silver image was formed on a photographic material as was used in Example 6, then bleached with the following bleaching solution (20° C, 5 min.), and then toned with the following toning solution (20° C, 5 min.).

| Bleaching Solution | |
|---|---|
| Potassium Ferricyanide | 10 g |
| Ammonia Water (28%) | 10 ml |
| Water | 200 ml |
| Toning Solution | |
| Ferric Chloride | 1 g |
| Hydrochloric Acid (37.2%) | 4 ml |
| Water | 200 ml |

The silver image was converted into a image of iron (III) hexacyanoferrate and silver chloride. The thus formed silver chloride was reduced to silver using the developer described in Example 1, and then the image was toned again using the toning solution and conditions as described in Example 6. After rinsing in water and drying, the baking and subsequent procedures as described in Example 6 were conducted, and substantially the same results as described in Example 6 were obtained. The resist was not damaged by ion-etching as in Example 1 for 25 minutes.

EXAMPLE 8

The same procedures as described in Example 1 were followed except for coating a 0.2 to 0.3 μ subbing layer having the following composition on the soda lime glass plate using an immersion method and drying the subbing layer for 15 minutes at 130° C prior to coating the silver halide photographic emulsion thereon.

| Subbing Solution | |
|---|---|
| A solution prepared by adding 0.45 g of nitrocellulose (nitrocellulose RS ½; made by Daisel Ltd.) and 10.0 g of acetone, while stirring, to a gelatin dispersion comprising: | |
| Gelatin | 0.4 g |
| Salicylic Acid | 0.12 g |
| Methanol | 0.18 g |
| Ethylene Chloride | 55.0 g |
| Acetone | 15.0 g |

Results similar to Example 1 were obtained.

While the invention has been described in detail and with reference to specific embodiments thereof, it will be apparent to one skilled in the art that various changes and modifications can be made therein without departing from the spirit and scope thereof.

What is claimed is:

1. A method for producing an image comprising forming silver image and non-silver image areas on a photographic material which comprises a substrate having thereon at least one silver halide emulsion layer, either directly or at least one subbing layer on the substrate, by exposing and developing said photographic material, heating the material at 150° to 600° C and then ion bombarding said material to imagewise ion-etch away the layer or layers above the substrate to remove the non-silver image areas of the emulsion layer without completely removing the silver image areas.

2. The method of claim 1, wherein said silver halide emulsion layer is an emulsion layer of silver chloride, silver bromide, silver iodide, silver chlorobromide, silver bromoiodide, silver chlorobromoiodide or a mixture thereof.

3. The method of claim 2, wherein said silver halide emulsion is an emulsion containing about 90 mole% or more silver bromide and not more than about 5 mole% silver iodide, where the mean grain size of the silver halide grains is not more than about 0.1 micron, and wherein the weight ratio of the silver halide to the water-soluble binder of the emulsion is about 1:4 to about 6:1.

4. The method of claim 2, wherein said silver halide emulsion is an emulsion which contains about 50 mole% or more silver chloride and contains silver halide grains having a mean grain size of not more than about 1 micron.

5. The method of claim 1, wherein said ion-etching is a cathode sputtering.

6. A method for producing an image comprising:
   (a) forming silver image and non-silver image areas on a photographic material which comprises a substrate having thereon at least one silver halide emulsion layer, either directly or on at least one subbing layer on the substrate, by exposing and developing said photographic material;
   (b) intensifying and/or toning said silver image at least once by subjecting said silver image to a treatment selected from the group consisting of mercury intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning, and (c) then ion bombarding said material to imagewise ion-etch away the layer or layers above the substrate to remove the non-silver image areas of the emulsion layer without completely removing the silver image areas.

7. The method of claim 6, wherein said silver halide emulsion layer is an emulsion layer of silver chloride, silver bromide, silver iodide, silver chlorobromide, silver bromoiodide, silver chlorobromoiodide or a mixture thereof.

8. The method of claim 7, wherein said silver halide emulsion is an emulsion containing about 90 mole% or more silver bromide and not more than about 5 mole% silver iodide, where the mean grain size of the silver halide grains is not more than about 0.1 micron, and wherein the weight ratio of the silver halide to the water-soluble binder of the emusion is about 1:4 to about 6:1.

9. The method of claim 7, wherein said silver halide emulsion is an emulsion which contains about 50 mole% or more silver chloride and contains silver halide grains having a mean grain size of not more than about 1 micron.

10. The method of claim 6 further comprising heating the photographic material to decompose the binder prior to said ion-etching.

11. The method of claim 10, wherein said heating is about 150° C to about 600° C.

12. The method of claim 6, wherein said ion-etching is a cathode sputtering.

13. A method for producing an image comprising:
(a) forming silver image and non-silver image areas on a photographic material which comprises a transparent substrate having a masking layer thereon, said masking layer having at least one silver halide emulsion layer, either directly or on at least one subbing layer on the masking layer, by exposing and developing said photographic material;
(b) intensifying and/or toning said silver image at least once by subjecting said silver image to a treatment selected from the group consisting of mercury intensification, copper intensification, lead intensification, uranium toning, selenium toning, sulfur toning, iron toning, nickel toning, cobalt toning, copper toning, vanadium toning, titanium toning, lead chromate toning, cadmium toning and noble metal toning.
(c) ion bombarding said material to ion-etch away the layer or layers above the masking layer to remove the non-silver image areas of the silver halide emulsion layer and uncover the masking layer lying thereunder without completely removing the silver image areas; and
(d) then etching away the masking layer at the uncovered areas.

14. The method of claim 13, wherein said transparent substrate is a glass plate, quartz, sapphire or a synthetic resin.

15. The method of claim 13, wherein said masking layer is a layer of a material which transmits visible light and absorbs ultraviolet light.

16. The method of claim 13, wherein said masking layer is a layer of a metal, a metal oxide, a semi-metal, a chalcogen glass or a mixture thereof.

17. The method of claim 16, wherein said metal oxide is silicon oxide, chromium oxide, ferric oxide, iron (II) – iron (III) oxide, cuprous oxide, cupric oxide, nickel oxide, cobalt oxide, cadmium oxide, germanium oxide, titanium oxide, or tantalum oxide; said metal is chromium, aluminum, silver, titanium, cobalt, tungsten, tellurium, nickel, gold, platinum, iridium, palladium, rhodium, molbydenum, tantalum, a nickel-iron alloy, a nickel-chromium-iron alloy, an aluminum-iron alloy, a chromium-iron alloy, a chromium-aluminum alloy, a silicon-gold alloy, a titanium-aluminum alloy, a copper-beryllium alloy, a cobalt-iron alloy, a cobalt-nickel alloy, or a nickel-chromium alloy; said semi-metal is germanium or silicon; said chalcogen glass is As-S-Ge, As-Se-Ge, or Ge-S; and said mixture thereof is chromium-chromium oxide (chromium oxide on chromium) or silicon-silicon oxide (silicon oxide on silicon).

18. The method of claim 15, wherein said masking layer transmits light of a wavelength not less than about 450 nm and absorbs light of a wavelength shorter than about 450 nm.

19. The method of claim 13, wherein said masking layer has a thickness ranging from about 0.01 micron to about 10 microns.

20. The method of claim 13, wherein said silver halide emulsion layer is an emulsion layer of silver chloride, silver bromide, silver iodide, silver chlorobromide, silver bromoiodide, silver chlorobromoiodide or a mixture thereof.

21. The method of claim 20, wherein said silver halide emulsion is an emulsion containing about 90 mole% or more silver bromide and not more than about 5 mole% silver iodide, wherein the mean grain size of the silver halide grains is not more than about 0.1 micron, and wherein the weight ratio of the silver halide to the water-soluble binder of the emulsion is about 1:4 to about 6:1.

22. The method of claim 20, wherein said silver halide emulsion is an emulsion which contains about 50 mole% or more silver chloride and contains silver halide grains having a mean grain size of not more than about 1 micron.

23. The method of claim 13 further comprising heating the photographic material to decompose the binder prior to said ion-etching.

24. The method of claim 23, wherein said heating is at about 150° C to about 600° C.

25. The method of claim 13, wherein said ion-etching is a cathode sputtering.

26. The method of claim 13, wherein said etching of said masking layer is by ion-etching.

27. The method of claim 13, wherein said etching of said masking layer is by chemical etching.

28. The method of claim 13 further comprising removing the emulsion layer at the image areas to leave the masking layer thereunder.

29. The method of claim 28, wherein said removing of the emulsion layer at the image areas is by swelling or dissolving in a solution of an acid, an alkali or a salt.

30. The method of claim 29, wherein the acid is nitric acid or sulfuric acid, the alkali is sodium hydroxide or potassium hydroxide, and the salt is sodium hypochlorite or potassium hypochlorite.

31. The method of claim 1 wherein said heating is at about 300° C to about 600° C.

32. The method of claim 10 wherein said heating is at about 300° C to about 600° C.

33. The method of claim 23 wherein said heating is at about 300° C to about 600° C.

* * * * *